(12) United States Patent  (10) Patent No.: US 9,310,425 B2
Jiun-Jie et al.  (45) Date of Patent: Apr. 12, 2016

(54) RELIABILITY ASSESSMENT OF CAPACITOR DEVICE

(75) Inventors: Huang Jiun-Jie, Kaohsiung (TW); Chi-Yen Lin, Tainan (TW); Ling-Sung Wang, Tainan (TW); Chih-Fu Chang, Neipu Township, Pingtung County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 359 days.

(21) Appl. No.: 13/175,263

(22) Filed: Jul. 1, 2011

(65) Prior Publication Data

US 2013/0002263 A1 Jan. 3, 2013

(51) Int. Cl.
*G01R 31/28* (2006.01)
(52) U.S. Cl.
CPC .................. *G01R 31/2856* (2013.01)
(58) Field of Classification Search
CPC ....................................... G01R 31/26
USPC ......................................... 324/548
See application file for complete search history.

(56) References Cited

U.S. PATENT DOCUMENTS

| | | | | |
|---|---|---|---|---|
| 5,625,288 A | * | 4/1997 | Snyder et al. | 324/750.06 |
| 6,077,719 A | * | 6/2000 | Koike | 438/17 |
| 6,281,541 B1 | | 8/2001 | Hu | |
| 6,871,307 B2 | * | 3/2005 | Nachumovsky | 714/718 |
| 6,952,654 B2 | | 10/2005 | Park et al. | |
| 7,485,921 B2 | | 2/2009 | Kawaguchi et al. | |
| 7,943,542 B2 | * | 5/2011 | Umeda et al. | 501/139 |
| 8,053,257 B2 | * | 11/2011 | Chanda et al. | 438/17 |
| 2007/0123015 A1 | * | 5/2007 | Chinthakindi et al. | 438/597 |
| 2008/0128692 A1 | | 6/2008 | Shi et al. | |
| 2011/0057293 A1 | | 3/2011 | Tsai | |

OTHER PUBLICATIONS

NPL—MOM capacitor design Challenges and solutions.*

* cited by examiner

*Primary Examiner* — Tung X Nguyen
*Assistant Examiner* — Feba Pothen
(74) *Attorney, Agent, or Firm* — Haynes and Boone, LLP

(57) ABSTRACT

A method of reliability testing of a semiconductor device is described. The embodiment, includes providing a capacitor including an insulating layer interposing two conductive layers. A plurality of voltages are provided to the capacitor including providing a first voltage and a second voltage greater than the first voltage. A leakage associated with the capacitor is measured while applying the second voltage. In an embodiment, the leakage measured while applying the second voltage indicates that a failure of the insulating layer of the capacitor has occurred. In an embodiment, the capacitor is an inter-digitated metal-oxide-metal (MOM) capacitor. The reliability testing may be correlated to TDDB test results. The reliability testing may be performed at a wafer-level.

17 Claims, 7 Drawing Sheets

RELIABILITY ASSESSMENT OF CAPACITOR DEVICE

BACKGROUND

There are a number of physical failure mechanisms that can affect the reliability of a semiconductor device. Time dependent dielectric breakdown (TDDB) is one reliability test typically performed. TDDB tests the wear out of an insulating material leading to a conductive path through the insulating material. The TDDB lifetime depends on the quality of the insulating material. As technology progresses and thicknesses of insulating material decrease, maintaining TDDB lifetimes becomes more challenging and more critical.

Though TDDB produces useful data, it has disadvantages. One disadvantage is the time it takes to obtain test results. TDDB procedures are performed on packaged (assembled) devices. Thus, the test results are dependent upon packaging time, as well as the test performance time. Typical test performance times can run 6 to 7 days.

Thus, what is needed an efficient effective reliability assessment of semiconductor devices.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Furthermore, the present disclosure is described as applying to capacitors in general, and metal-oxide-metal (MOM) capacitors in particular. However, one of ordinary skill in the art would recognize the described methods and apparatus may be applied to other semiconductor devices, including other capacitor structures now known or later discovered.

In a TDDB test, the dielectric breakdown of a capacitor dielectric is determined by stressing the dielectric by applying an electric field (MV/cm) to the capacitor. The time it takes to breakdown the dielectric is measured. From data over several capacitors, a median lifetime is determined. The median lifetime may be referred to as a mean time to failure (MTTF). The unit from the TDDB test is a time unit (e.g., second). As discussed above, disadvantages of the TDDB test have been recognized by the inventors. For example, the TDDB test takes numerous days to obtain results. For example, the test devices must be assembled (e.g., packaged) and the test performed. Under typical conditions, it may take 7-8 days for assembly and 6-7 days to perform the test. Thus, the reliability assessment does not provide anywhere near real-time data. Reliability assessments that reduce one or more of these disadvantages are discussed herein.

Figure 1:
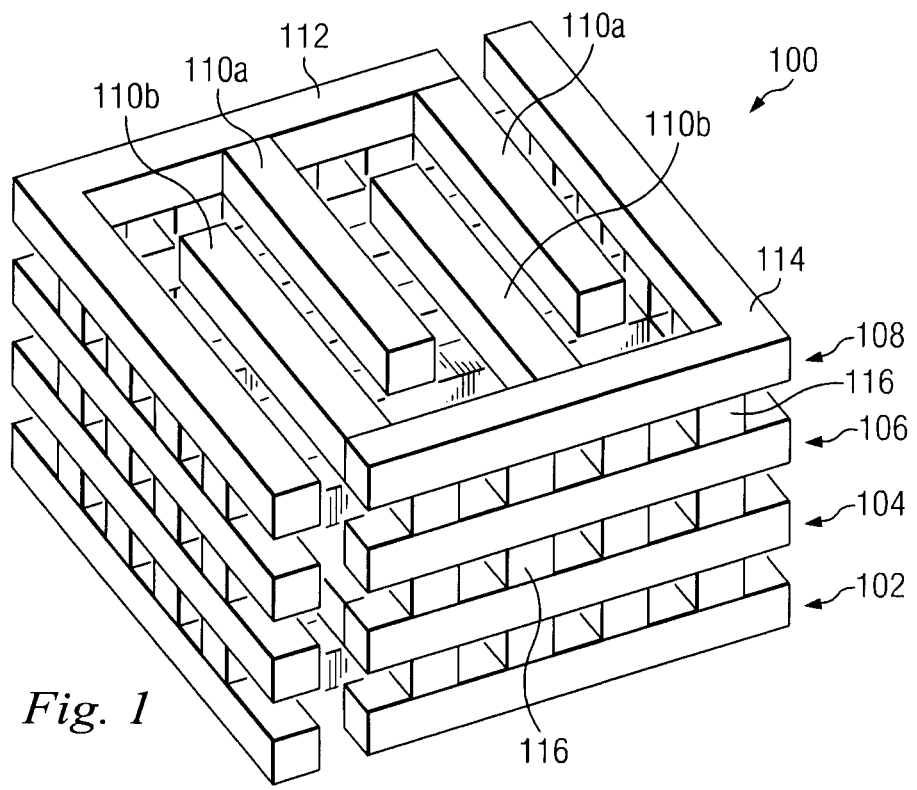
FIG. 1 is a perspective-view of an embodiment of an inter-digitated metal-oxide-metal (MOM) capacitor.
Figure 2:
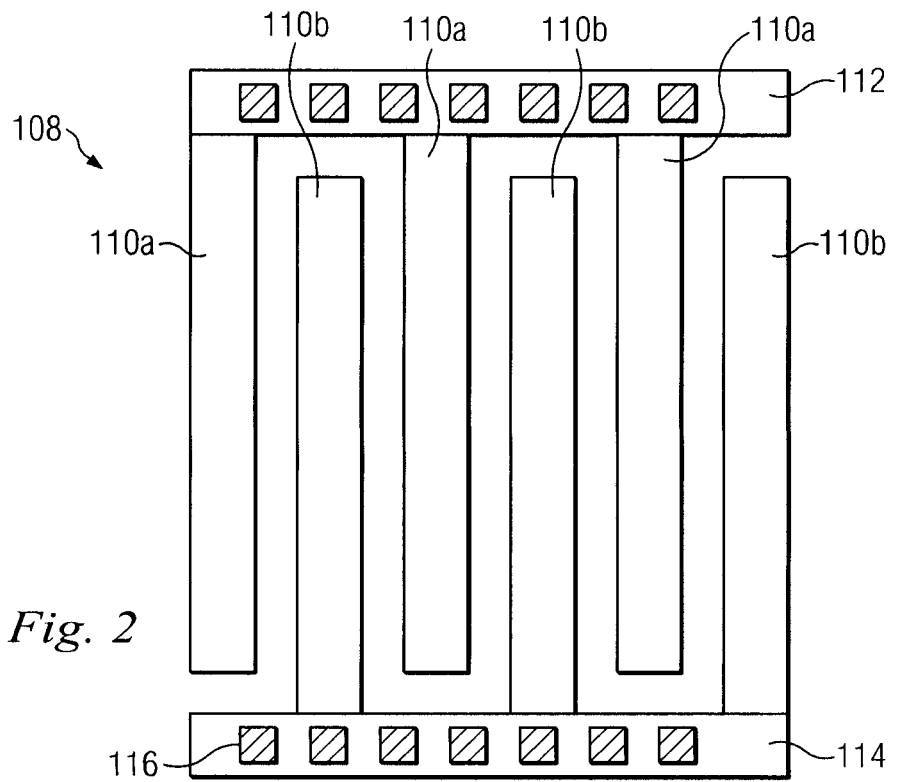
FIG. 2 is a top view of an embodiment of a portion of an inter-digitated MOM capacitor.

Referring now to FIG. 1, illustrated is a MOM capacitor 100. The MOM capacitor 100 is one type of semiconductor device. The MOM capacitor 100 is an inter-digitated capacitor. The MOM capacitor 100 includes a plurality of layers 102, 104, 106, and 108. Layer 108 is exemplary and includes conductive fingers 110a and 110b. A top view of layer 108 is illustrated in FIG. 2. Conductive fingers 110a are connected to a bus 112; conductive fingers 110b are connected to a bus 114. The conductive fingers 110a may be conducted to the same electricity—i.e., have the same electrical polarity (e.g., − or +). The conductive fingers 110b may be connected to the same electricity—i.e., have the same electrical polarity (e.g., − or +). The conductive fingers 110a may at the opposite polarity of the conductive fingers 110a. The conductive fingers 110a of the same potential on different layers (e.g., 102, 104, 106, 108) are connected to each by vias 116.

The conductive fingers 110a and/or 110b may include a metal composition, polysilicon, and/or other conductive material. The buses 112, 114 may include a metal composition, polysilicon, and/or other conductive material. As illustrated in FIGS. 1 and 2, the electrode pattern (e.g., fingers) of each layer is inter-digitated, for example, alternating 110a and 110b or alternating + and − polarity. In an embodiment, the bus 112 and fingers 110a are at a (+) charge and the bus 114 and fingers 110b are at a (−) charge.

Interposing each layer 102, 104, 106 and 108 is an insulating material or dielectric. In an embodiment, the insulating material is an oxide. Exemplary materials for the interposing insulating layers include aluminum oxide, deposited silicon dioxide, or any BEOL dielectric or stack of dielectric materials such as, silicon oxynitride, a low k material, tetraethylorthosilicate (TEOS) oxide, un-doped silicon glass, or doped silicon oxide such as borophosphosilicate glass (BPSG), fused silica glass (FSG), phosphosilicate glass (PSG), boron doped silicon glass (BSG), and/or other suitable materials. The insulating material may be formed by chemical vapor deposition (CVD), high density plasma CVD, spin-on methods, sputtering, and/or other suitable methods.

MOM devices, such as MOM capacitor 100, are capable of providing increased parallel capacitance. One application for MOM devices, such as MOM capacitor 100, is for wireless communication devices. For example, a high frequency device. In an embodiment, the MOM capacitor 100 may be used in high frequency (GHz) device or mixed-signal analog devices. The MOM capacitor 100 may function as a typical capacitor, where the potential difference between conductors (e.g., 110*a* and 110*b*) causes an electric field to develop across the insulator (dielectric) provided between the conductors, providing a (+) charge on a plurality of conductors and a (−) charge on the opposing conductors (e.g., 110*a* and 110*b*).

The MOM capacitor 100 may be fabricated using semiconductor fabrication processes including typical back-end-of-the-line (BEOL) processes. FIG. 1 is intended to an exemplary embodiment of capacitors in general and MOM capacitors in particular. Other types of capacitors are recognized in the art including other types of MOM capacitors such as parallel plate MOM capacitors; these devices may also benefit from the reliability assessments discussed herein.

Figure 3A:
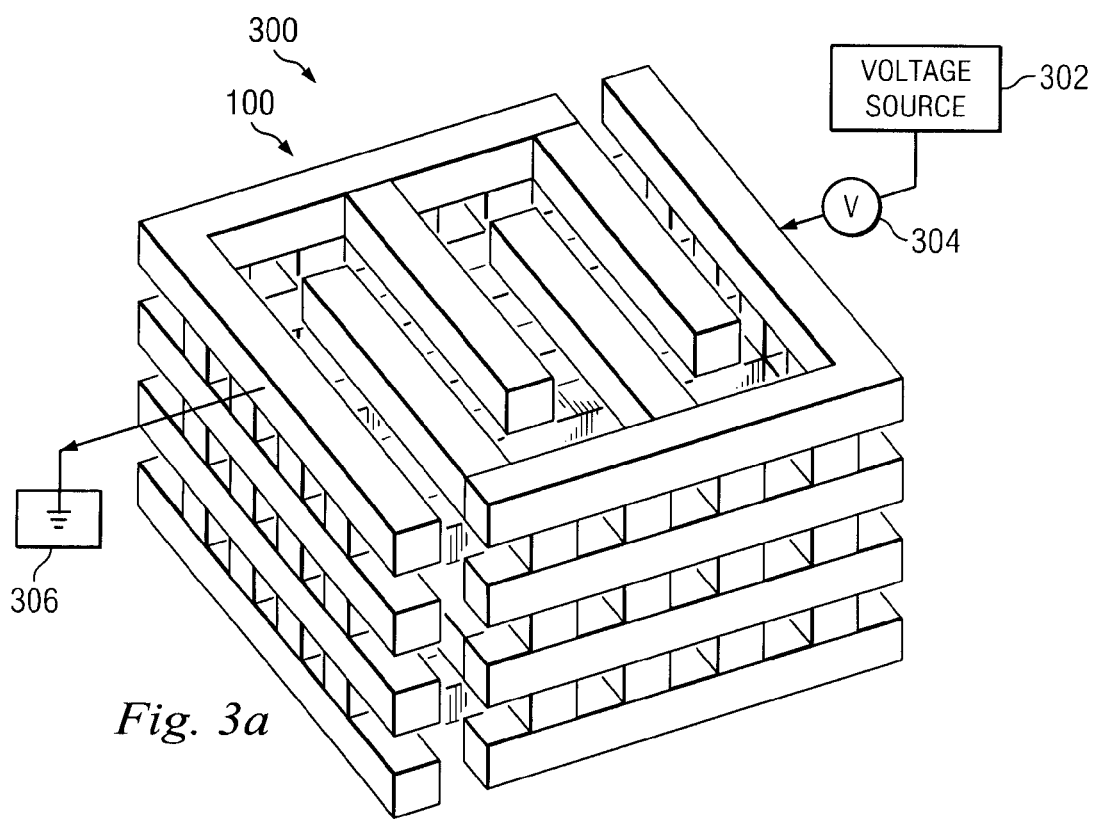
FIG. 3a is a schematic view of an embodiment of a reliability assessment system applied to the MOM capacitor of FIG. 1.

Referring now to FIG. 3*a*, illustrated is a schematic of an apparatus 300 for providing a reliability assessment. The apparatus 300 may be used to perform a ramp to voltage breakdown test of a semiconductor device. A ramp to voltage breakdown reliability test may be substantially similar to the method described below with reference to FIG. 4. For example, a voltage may be ramped to a level that causes a defect to form in the insulating material of a capacitor (e.g., breakdown). FIG. 3 illustrates the apparatus including a device under test (DUT) of the MOM device 100, described above with reference to FIG. 1. A voltage source 302 provides a voltage 304 to the DUT—the MOM capacitor 100. The voltage source 302 is connected to ground 306. The DUT may be in wafer form or an assembled semiconductor device.

In an embodiment of operation, the voltage 304 is provided at an initial voltage level. The voltage source 302 is operable to provide a variable voltage 304. For example, the voltage source 302 provides the voltage 304 at an initial voltage. The voltage source 302 is also operable to increase the voltage level 304 (e.g., ramp) throughout the performance of the assessment. In an embodiment, the apparatus 300 also includes a monitoring device. The monitoring device may allow for detection of a defect produced in the insulating layer interposing the fingers 110*a* and/or 110*b* and/or the layers of the MOM capacitor 100. The monitoring device may detect a leakage from the DUT.

Figure 3B:
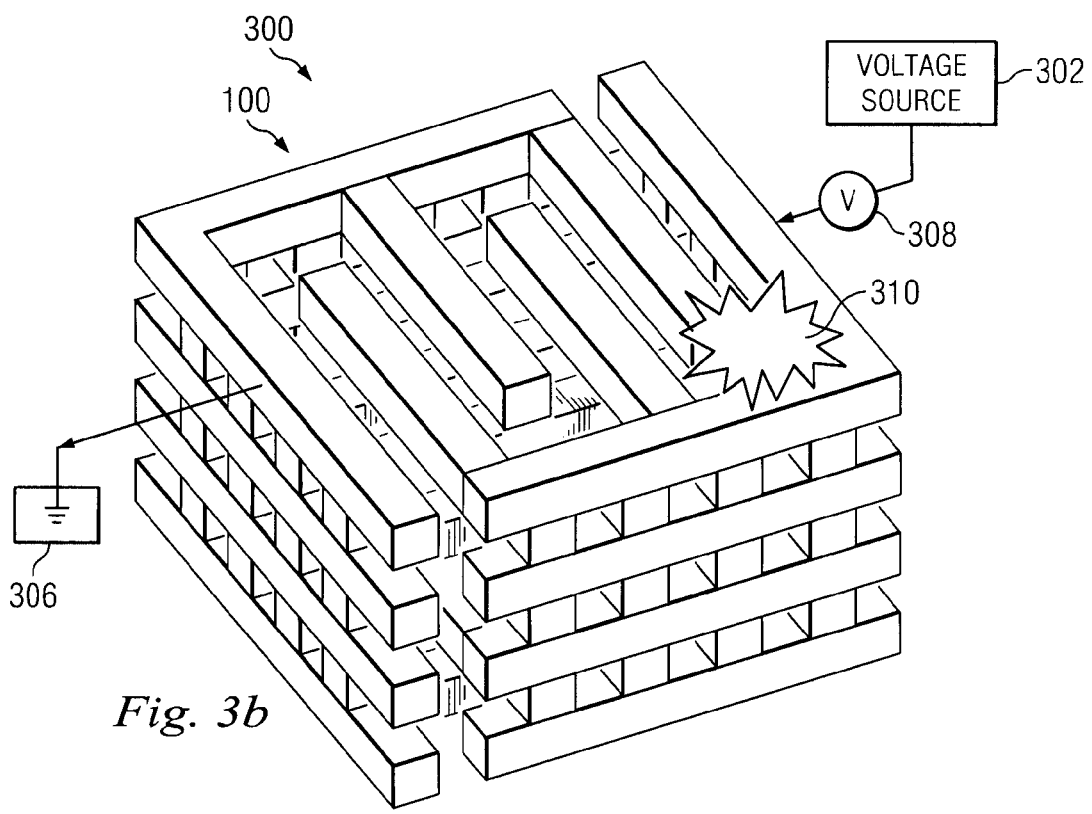
FIG. 3b is a schematic view of the embodiment of a reliability assessment system of FIG. 3a including a generated defect.

FIG. 3*b* illustrates a defect 310 generated in the insulating layer of the MOM capacitor 100. The defect 310 may be referred to as a leakage burst. A monitoring device may monitor a leakage level associated with the MOM capacitor 100 in order to detect the defect 310. In the illustrated embodiment, the defect 310 occurs at a failure voltage 308 provided from the voltage source 302. In an embodiment, the defect 310 is substantially similar to a type of defect caused by TDDB reliability testing.

The apparatus 300 may be used to perform a reliability assessment or test of the MOM capacitor 100. Exemplary reliability assessment methods are provided in FIG. 4. The reliability test may include ramping the voltage 304 provided from the voltage source 302. The monitoring device monitors the leakage from the MOM capacitor until the device detects a failure (e.g., breakdown or defect) of the insulating layer (e.g., oxide) of the MOM capacitor. The voltage that provides the "failure" is recorded. In an embodiment, the recorded voltage is associated with a reliability of the MOM capacitor and/or device including the MOM capacitor.

Figure 4:
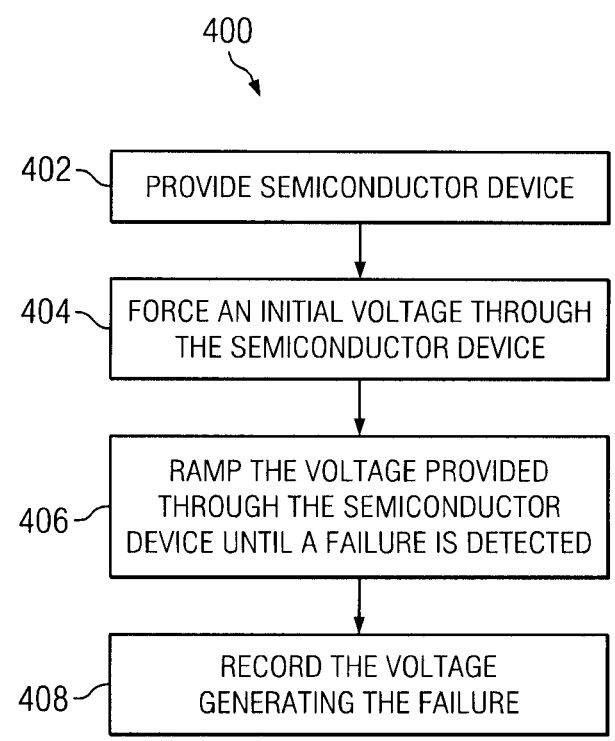
FIG. 4 is a flow chart of an embodiment of a method of reliability assessment.

Referring now to FIG. 4, illustrated is a method 400 of performing a reliability assessment of a device, such as a MOM capacitor described above with reference to FIGS. 1 and 2. The method 400 may be used to determine a reliability and/or quality of a product or process.

The method 400 begins at block 402 where a device is provided. In an embodiment, the device includes a capacitor. The capacitor may include an insulating layer interposing two conductive layers. In a further embodiment, the capacitor is an inter-digitated capacitor. In an embodiment, the device provided is a MOM capacitor. The MOM capacitor may be substantially similar to as described above with reference to FIGS. 1 and 2.

The device provided may be provided as an assembled device, or as a wafer-level device. A wafer-level device includes devices formed on substrates (e.g., semiconductor substrates or wafers) that have not yet been assembled or packaged. In an embodiment, the wafer-level devices are provided on a semiconductor substrate prior to dicing. The device provided in block 402 may be a product-level (e.g., a device) or portion thereof. In an embodiment, the device(s) provided in block 402 may be partially fabricated. In an alternative embodiment, the device provided may be a test structure. In an embodiment, the test structure is formed on a semiconductor wafer with a plurality of product-level devices (die). The test structure may include a capacitor and/or a plurality of additional test structures such as may be used in process control monitoring (PCM or e-test) in a semiconductor fabrication process. In an embodiment, 30 devices or more are provided for testing in block 402.

The method 400 then proceeds to block 404 where an initial voltage is provided to the device, and subsequently to block 406 where the voltage provided to the device is (repeatedly) increased (or ramped). In an embodiment, the voltages may be provided using the apparatus 300, described above with reference to FIGS. 3*a* and 3*b*. The voltage may be increased until the point of failure, as discussed in further detail below. The increasing of the voltage may be referred to herein as ramping the voltage.

In an embodiment, the voltages are provided at room temperature (e.g., approximately 25 C). In an alternative embodiment, the voltages are provided to a device at an elevated temperature. By way of example, the provided device may be tested at approximately 125 C.

The point of failure (e.g., the failure voltage) may be determined by the generation of a defect in the device under test. The presence of a generated defect may be determined from a leakage level measured from a monitor of the device. In an embodiment, the generated defect is a defect of the insulating material of a capacitor. In an embodiment, the voltage is increased until a voltage is reached that breaks down the insulator layer (e.g., oxide) of the capacitor. For example, the generated defect may be substantially similar to the defect 310, described above with reference to FIG. 3*b*. When a leakage level is determined to be over a predetermined threshold, a defect is considered to have been created/generated. This voltage is termed the failure or breakdown voltage.

The block 406 may include numerous other tests typical of a semiconductor fabrication process. For example, the ramp to voltage breakdown of the block 406 may be performed as a portion of a PCM monitor of a semiconductor fabrication process.

The method 400 then continues to block 408 where the voltage at which the defect is created (e.g., the insulator of a capacitor breaks down) is recorded. The voltage may be recorded on a computer-readable medium for use in other semiconductor fabrication processes and/or tools. The voltage may be recorded on a computer-readable medium such that it can be accessed by a customer, engineering personnel, and/or other suitable entities. The recorded voltage (i.e., the failure or breakdown voltage) is in units of volts (V).

In an embodiment, the recorded failure voltage is used to disposition material. For example, the semiconductor wafer including the provided device may be dispositioned, one or more substrates associated with the tested device (e.g., additional wafers from the same lot) may be dispositioned, and/or other related materials. The disposition determined may be to scrap the substrate(s), re-work the substrate(s), or continue to process the substrate(s) (for example, by assembling the devices).

In an embodiment, the recorded failure voltage is used to determine a reliability metric associated with the tested device or product including the tested device. Thus, the recorded voltage may be used to determine a qualification of a product. For example, the recorded voltage may be correlated with an expected TDDB lifetime.

As described above, embodiments of the method 400 may be referred to as a ramp to breakdown voltage test. The method 400 may be advantageous in that it is operable to determine a level of reliability of the device, and/or devices associated with the test device. A device associated with the test device may be another device of the same design, another device formed on the same semiconductor substrate, another device formed on a different semiconductor substrate that was processed similarly (e.g., within the same fabrication lot), another device formed on the same fabrication line, and/or other associated devices.

Figure 5A:
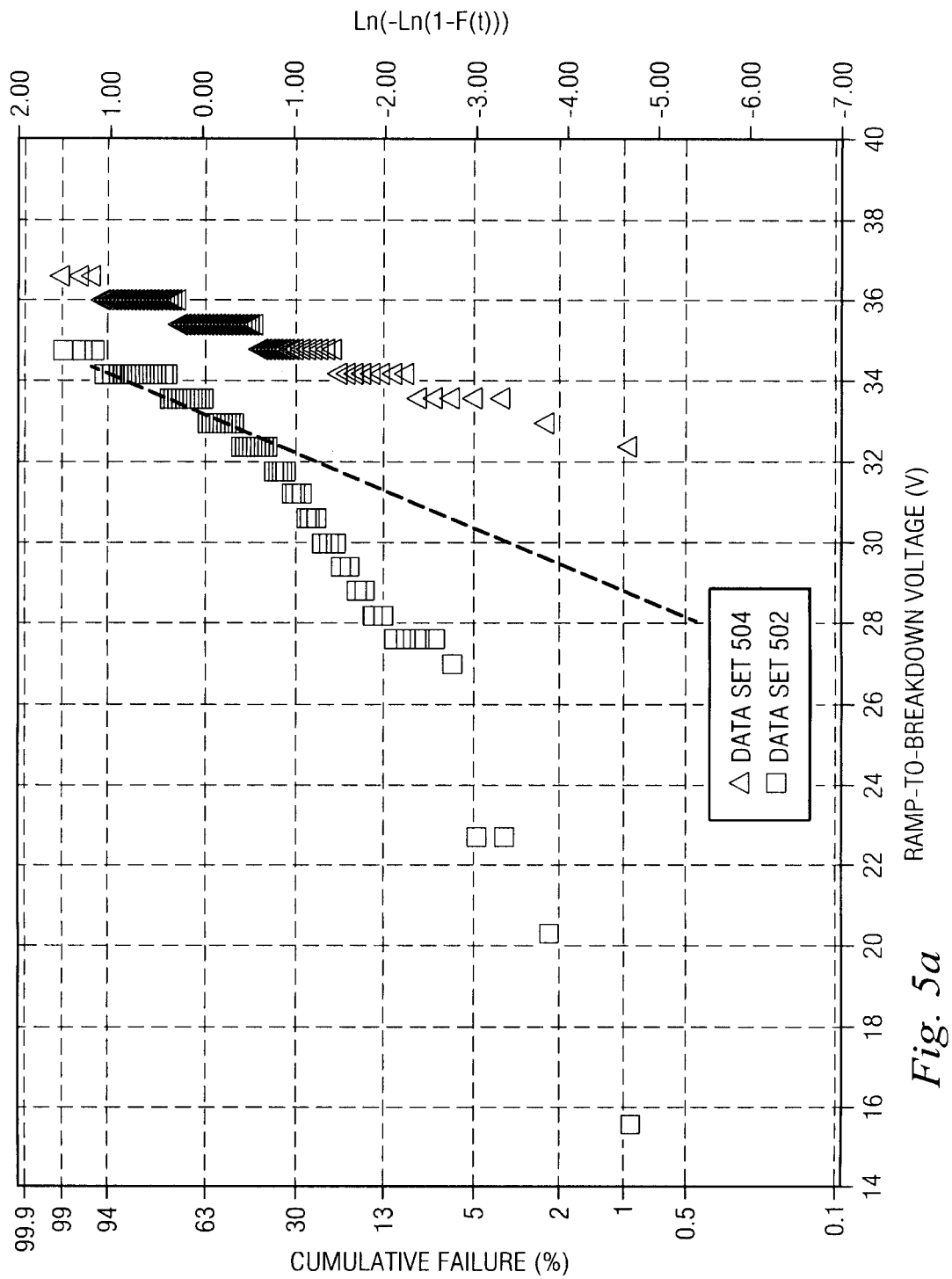
FIGS. 5a and 5b illustrate an embodiment of an association between a ramp to voltage breakdown and TDDB reliability assessments.
Figure 5B:
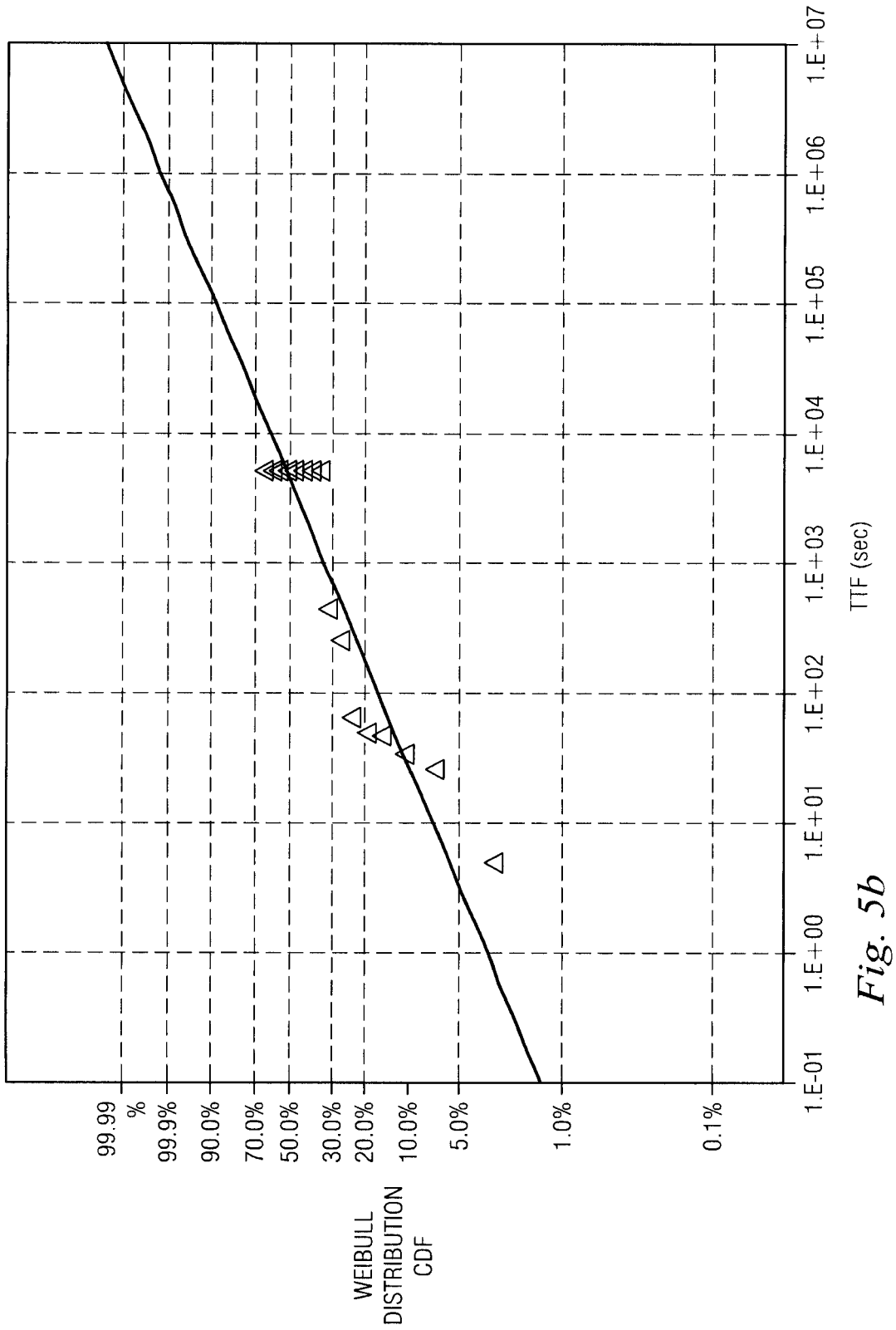

Referring now to the FIGS. 5a and 5b, illustrated is a comparison of a ramp to breakdown voltage test of a wafer-level device (shown in FIG. 5a) and results from a conventional packaged product level TDDB assessment (shown in FIG. 5b). The ramp to breakdown voltage test results of FIG. 5a may be obtained using a method substantially similar to FIG. 4. The vertical axis of both graphs illustrated a Weibull Distribution of cumulative failures. The x-axis of graph FIG. 5a illustrates the voltage of the Ramp-to-Breakdown where failure (e.g., insulator break-down) occurred. The x-axis of the graph of FIG. 5b illustrates the lifetime (in time to fail (TTF) seconds) of the TDDB test.

Generally, FIG. 5a illustrates wafer level data or results from testing performed on wafer-level devices. FIG. 5b illustrates assembled product-level data or results from TDDB testing performed on assembled (packaged) devices. FIG. 5a includes two data sets, one at approximately 125 C and one at approximately 25 C. FIG. 5b depicts TDDB results at approximately 125 C. It is noted that the data of FIG. 5a and the data of FIG. 5b may be correlated to one another. In other words, a comparison of FIGS. 5a and 5b illustrate that a ramp to breakdown voltage test, for example, such as described above with reference to FIG. 4, may be a suitable substitute and/or supplementary to the conventional TDDB assessments.

Figure 6:
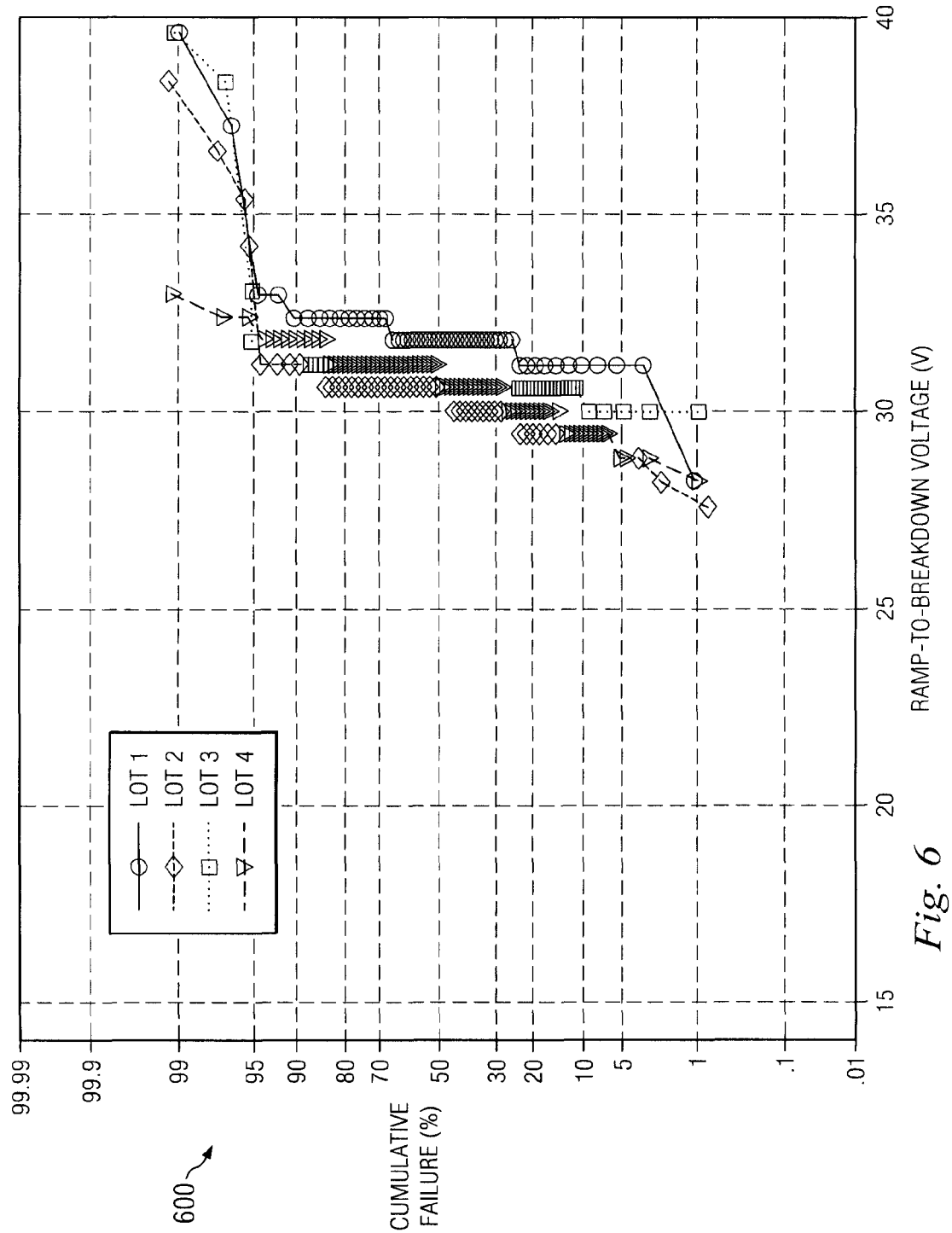
FIGS. 6-7 are graphical representations of experimental embodiments associated with an embodiment of the method of FIG. 4.
Figure 7:
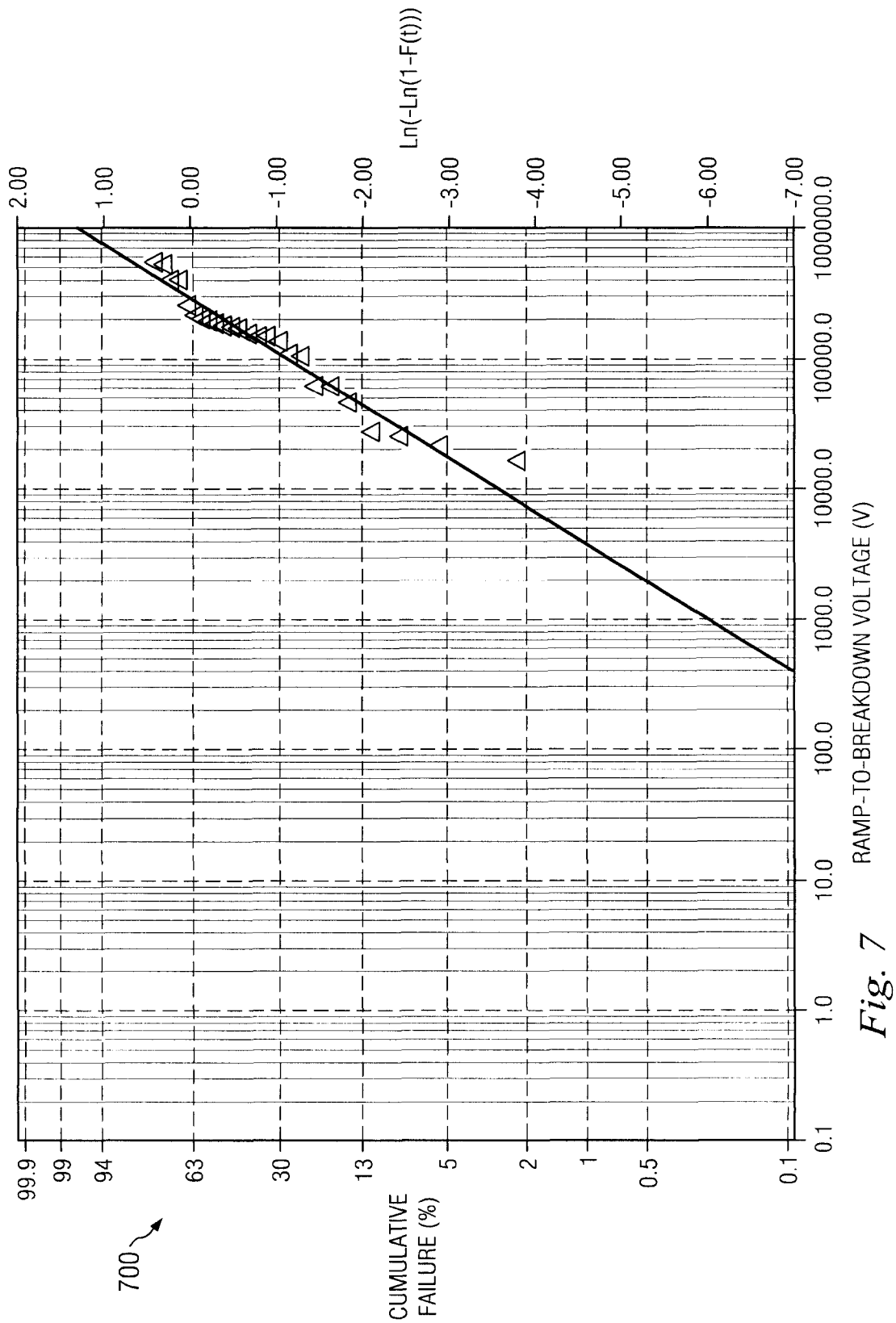

Referring now to FIGS. 6 and 7, illustrated are graphs 600 and 700 respectively. Graphs 600 and 700 include an x-axis of voltage (V). The voltage graphed may be the voltage at which a breakdown of the device (e.g., insulator of a capacitor) occurred. Graphs 600 and 700 include a y-axis of cumulative failures in percentages (e.g., from a Weibull distribution). Graph 600 illustrates data from multiple lots (i.e., groups of wafers). Graphs 600 and 700 include data generated at a testing temperature of approximately 125 C.

In summary, the methods and devices disclosed herein provide for a reliability assessment of a semiconductor device such as a capacitor. In particular, a MOM capacitor may benefit from the disclosed assessments. Advantages of some embodiments of present disclosure include a reliability assessment that can be performed at a wafer-level and does not necessitate packaging. Advantages of some embodiments of the present disclosure include a reliability assessment that is effective and efficient to perform. It is understood that different embodiments disclosed herein offer different disclosure, and that they may make various changes, substitutions and alterations herein without departing from the spirit and scope of the present disclosure.

In an embodiment described above, a method of reliability testing of a semiconductor device is provided. The embodiment includes providing a capacitor including an insulating layer interposing two conductive layers. A plurality of voltages is provided to the capacitor including providing a first voltage and a second voltage greater than the first voltage. A leakage associated with the capacitor is measured while applying the second voltage. In an embodiment, the leakage measured while applying the second voltage indicates that a failure of the insulating layer of the capacitor has occurred.

In an embodiment of the described method, the capacitor is a metal-oxide-metal (MOM) capacitor. In an embodiment, the provided capacitor is wafer-level device (e.g., formed on a semiconductor substrate prior to assembly). In yet another embodiment, the capacitor is a stacked, inter-digitated capacitor.

In a further embodiment of the method, providing the plurality of voltages includes ramping (e.g., increasing) the voltage provided. The providing the plurality of voltages may be one of a plurality of tests of a process control monitor (PCM) of a semiconductor fabrication process.

In yet another embodiment of the described method, measuring the leakage illustrates the breakdown of the insulating layer of the capacitor (e.g., the oxide of a MOM capacitor). The breakdown may illustrate a reliability metric of the capacitor.

In another embodiment of the present disclosure, a method of testing is described which includes providing a plurality wafer-level devices each having a metal-oxide-metal (MOM) capacitor formed thereon. The method continues by providing an initial voltage to each of the MOM capacitors. The voltage provided to each of the MOM capacitors is increased from the initial voltage to a failure voltage, which is determined by a leakage failure of the MOM capacitor. In an embodiment, the voltages are applied at room temperature; in an alternative embodiment, the voltages are applied at an elevated temperature (e.g., approximately 125 C).

In an embodiment, providing the plurality of wafer-level devices includes providing at least 30 wafer-level devices. The method may be one test of a plurality of tests included in a process control monitor (PCM) test.

The method may be used to disposition material, or in other words, to determine whether to process the plurality of semiconductor wafers based on the determined failure voltages. Additionally, or alternative, the failure voltage may be compared to a time dependent dielectric breakdown (TDDB) test result. See, e.g., FIGS. 5a 5b. In doing so, the failure voltage may represent a reliability metric for the plurality of wafer-level devices.

In yet another embodiment described herein, a method of testing a semiconductor device is provided which includes providing a wafer-level device including a metal-oxide-metal (MOM) capacitor. A voltage is forced through the MOM capacitor while the MOM capacitor is at a temperature greater than room temperature. The voltage forced through the MOM capacitor is then ramped from the initial voltage to a failure voltage. In an exemplary embodiment, the failure voltage is greater than 25 volts. See FIG. 6.

The MOM capacitor under test may be a test structure formed on a semiconductor wafer. Alternative, the MOM capacitor may be included on a product die of a semiconductor wafer.

Furthermore, provided is an apparatus for accomplishing one or more of the methods described above. The apparatus includes a voltage source operable to provide an increasing voltage to a wafer-level device (e.g., MOM capacitor). The apparatus further includes a system for monitoring a failure of the device under test (e.g., a leakage monitor).

What is claimed is:

1. A method of reliability testing of a semiconductor device, comprising:
   providing a production lot of semiconductor wafers including a first semiconductor wafer having a plurality of product-level devices and a structure providing a capacitor including an insulating layer interposing two conductive layers;
   performing a plurality of process control monitor (PCM) tests on the first semiconductor wafer, wherein the plurality of PCM tests includes:
      ramping a voltage provided to the capacitor including providing a first voltage and a second voltage greater than the first voltage, wherein the providing the second voltage generates a defect in the capacitor; wherein the first voltage and the second voltage providing during the ramping the voltage are provided at an elevated temperature;
      recording the second voltage having a unit of volts in a computer readable medium; and
      correlating the recorded second voltage to a time dependent dielectric breakdown (TDDB) lifetime for a packaged device thereby providing a determined TDDB lifetime for the plurality of product-level devices, wherein the correlating includes:
         providing a graph of a plurality of breakdown voltages in a unit of volts (V) plotted with respect to an associated TDDB lifetime in a unit of time, wherein the plurality of breakdown voltages includes at least one voltage having the same volts as the second voltage; and
         using the graph to calculate the determined TDDB lifetime for the packaged device based on the TDDB lifetime of the graph corresponding to the recorded second voltage; and
   using the second voltage to disposition the production lot of semiconductor wafers.

2. The method of claim 1, wherein the capacitor is a metal-oxide-metal (MOM) capacitor.

3. The method of claim 1, wherein the capacitor is wafer-level test structure.

4. The method of claim 1, wherein the provided capacitor is wafer-level device.

5. The method of claim 1, further comprising:
   measuring a leakage associated with the capacitor while applying the second voltage.

6. The method of claim 1, wherein the capacitor is a stacked, inter-digitated capacitor.

7. A method of testing, comprising:
   providing a plurality wafer-level devices having a metal-oxide-metal (MOM) capacitor formed thereon;
   performing a process control monitor (PCM) test, wherein the PCM test includes:
      determining a threshold leakage level for each of the MOM capacitors;
      providing an initial voltage to each of the MOM capacitors wherein the initial voltage is provided while the MOM capacitors are at approximately 125 C;
      measuring a first leakage level from each of the MOM capacitors while providing the initial voltage;
      increasing a voltage provided to each of the MOM capacitors from the initial voltage to a failure voltage;
      measuring a second leakage level from at least one of the MOM capacitors when the failure voltage is applied, wherein the failure voltage is breakdown of the oxide of the MOM capacitor;
      comparing the failure voltage in volts to a time dependent dielectric breakdown (TDDB) test result in a unit of time; and
      determining a first TDDB lifetime for the plurality of wafer-level devices using the compared failure voltage and TDDB test result.

8. The method of claim 7, wherein the providing the plurality of wafer-level devices includes providing at least 30 wafer-level devices.

9. The method of claim 7, further comprising:
   determining to process a plurality of semiconductor wafers associated with the plurality of wafer-level devices based on the determined failure voltages.

10. The method of claim 7, wherein the initial voltage is provided while the MOM capacitors are at approximately room temperature.

11. A method of testing a semiconductor device, comprising:
    providing a wafer-level device including a metal-oxide-metal (MOM) capacitor disposed on a first semiconductor substrate;
    forcing a voltage through the MOM capacitor while the MOM capacitor is at a temperature greater than room temperature; and
    ramping the voltage forced through the MOM capacitor from the initial voltage to a failure voltage, wherein the failure voltage is greater than the initial voltage and is determined by a leakage failure of the MOM capacitor, wherein the ramping the voltage is performed at approximately 125 C;
    correlating the failure voltage to a time dependent dielectric breakdown (TDDB) lifetime to determine a TDDB lifetime associated with the wafer-level device using a graph of breakdown voltage test results in volts (V) on a first axis and lifetime on a second axis, wherein the breakdown voltage test results are obtained from testing a plurality of wafer-level devices and the lifetime is obtained from testing a plurality of product-level devices; and
    dispositioning devices disposed on a second semiconductor substrate based on the failure voltage and the TDDB lifetime.

12. The method of claim 11, wherein the failure voltage is greater than 25 volts.

13. The method of claim 11, wherein the MOM capacitor is a test structure formed on a semiconductor wafer.

14. The method of claim 11, wherein the MOM capacitor is included on a product die of a semiconductor wafer.

15. The method of claim 1, wherein the determined TDDB lifetime for the plurality of product-level devices is a time unit.

16. The method of claim 7, wherein the TDDB test result is a result of a TDDB test performed on a packaged device.

17. The method of claim 11, wherein the correlating the failure voltage to the time TDDB lifetime includes correlating the failure voltage of a TDDB lifetime previously determined by testing of another packaged device.

* * * * *